July 13, 1965 J. E. FIELDEN ET AL 3,195,040

ELECTRONIC OSCILLATORS AND SELF-BALANCING POTENTIOMETER MEANS INCORPORATING SUCH OSCILLATORS

Filed Feb. 8, 1961 3 Sheets-Sheet 1

July 13, 1965 J. E. FIELDEN ET AL 3,195,040

ELECTRONIC OSCILLATORS AND SELF-BALANCING POTENTIOMETER MEANS INCORPORATING SUCH OSCILLATORS

Filed Feb. 8, 1961 3 Sheets-Sheet 2

INVENTORS
JOHN E. FIELDEN
ARTHUR WORLAND

BY Glascock, Downing & Seebold
ATTORNEYS

United States Patent Office 3,195,040
Patented July 13, 1965

3,195,040

ELECTRONIC OSCILLATORS AND SELF-BALANCING POTENTIOMETER MEANS INCORPORATING SUCH OSCILLATORS

John Ernest Fielden, Bowden, England, and Arthur Worland, Bangor, Wales, assignors to Fielden Electronics Limited, Manchester, England, a British company Filed Feb. 8, 1961, Ser. No. 87,832
Claims priority, application Great Britain, Feb. 8, 1960, 4,324/60
7 Claims. (Cl. 323—66)

This invention relates to electronic oscillators and it has for its object the provision of a novel oscillator having certain characteristics.

According to one aspect of the invention an electronic oscillator comprises an amplifier arranged to be self-oscillatory and having an inductive output winding, a chopper having input, output and control terminals and arranged to provide at its output terminals a train of pulses of an amplitude dependent upon the magnitude of a unidirectional input signal applied to said input terminals, of a phase dependent upon the polarity of said input signal and of a frequency equal to the frequency of an oscillatory potential applied to said control terminals, said output winding being inductively coupled to said control terminals, said output terminals being coupled to the input terminals of said amplifier and the arrangement being such that the amplitude of oscillation of said amplifier departs from a predetermined magnitude in proportion to the magnitude of said input signal and in a sense corresponding to the polarity of said input signal.

According to another aspect of the invention an electronic oscillator comprises an amplifier, a local oscillator arranged for generating oscillations of a predetermined amplitude, a mixer circuit to which the outputs of said amplifier and said local oscillator are applied and which provides in its output an oscillatory signal dependent upon the magnitude of the algebraic sum of the output signals from the amplifier and said local oscillator, a chopper having input, output and control windings and arranged to provide at its output terminals a train of pulses of an amplitude dependent upon the magnitude of a unidirectional input signal applied to said input terminals, of a phase dependent upon the polarity of said input signal and of a frequency equal to the frequency of an oscillatory potential applied to said control terminals, the output of said mixer or local oscillator being connected to said control terminals, said output terminals of said chopper being connected to the input terminals of said amplifier and the arrangement being such that the amplitude of the output signal of said mixer departs from a predetermined magnitude in proportion to the magnitude of said input signal and in a sense corresponding to the polarity of said input signal.

Embodiments of the invention will now be described, by way of example, with reference to the accompanying drawings, of which:

FIGURE 5 shows certain mechanical details of the embodiment of which FIGURE 4 is the circuit diagram.

In the figures the same circuit element is indicated by the same reference numeral.

Figure 1:
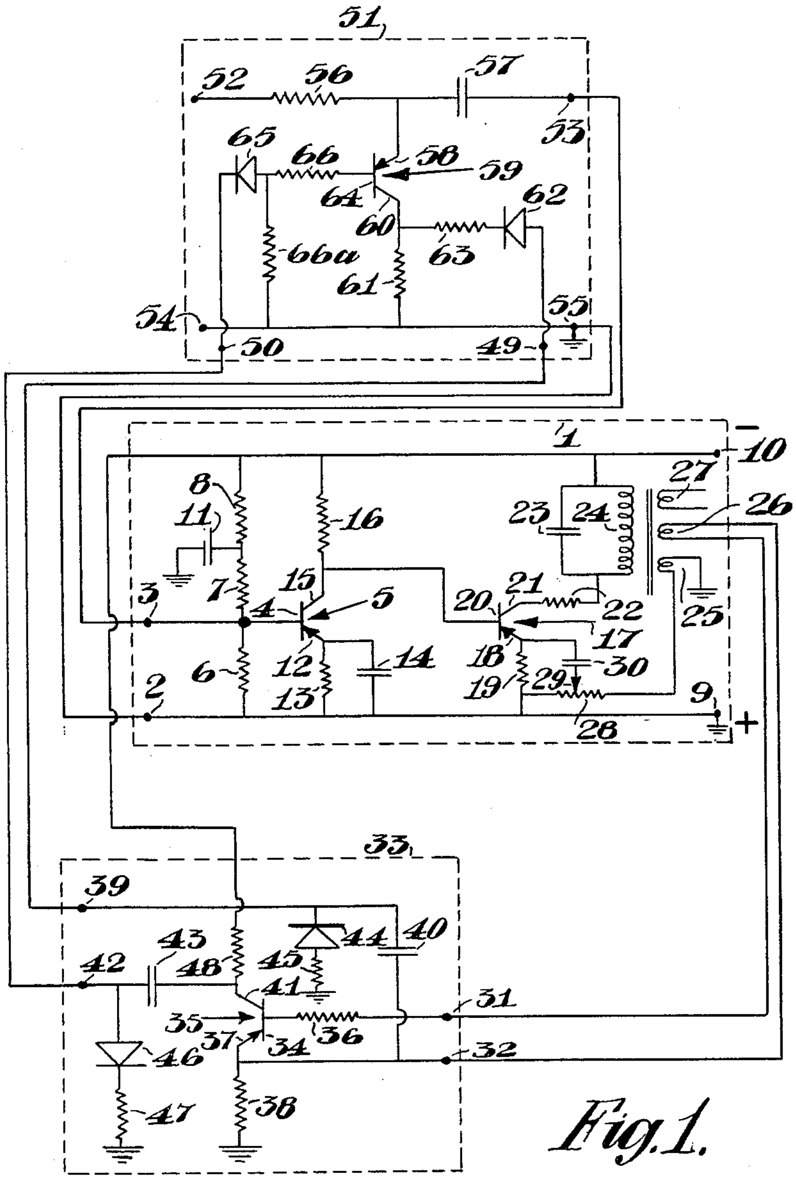
FIGURE 1 is the circuit diagram of one embodiment.

In the circuit diagram of FIGURE 1 an A.C. amplifier, indicated by the rectangle 1 has input terminal 3 connected to the base 4 of a transistor 5 and also to the common connection of resistors 6 and 7. Resistors 6, 7 and 8 are connected in series across power input terminals 9 and 10 to which a source of direct potential (not shown) is applied, the sense of that potential being such that terminal 9 is positive with respect to terminal 10. Terminal 9 is earthed. The base 4 is maintained at a mean potential determined by the ratio of the resistance of resistor 6 to that of resistors 7 and 8 combined. The common connection of resistors 7 and 8 is connected to earth via a capacitor 11, the resistor 8 and capacitor 11 being effective, in combination, to decouple the common connection of resistors 7 and 8 from terminal 10.

The emitter 12 of transistor 5 is connected to earth via resistor 13 and capacitor 14 connected in parallel. The collector 15 of transistor 5 is connected to terminal 10 via a resistor 16 and to the base 20 of transistor 17. The emitter 18 of transistor 17 is connected to earth via a resistor 19 and the collector 21 is connected to terminal 10 via a resistor 22 and a parallel connected oscillatory circuit consisting of a capacitor 23 and an inductor 24. The resistor 22 serves to limit to a safe value the peak current flowing in the collector-emitter circuit of transistor 17.

The inductor 24 forms the primary winding of a transformer having secondary windings 25, 26, and 27. One end of winding 25 is connected directly to earth and the other end is connected to earth via a potential divider 28, the slider 29 of which is connected to emitter 18 via a condenser 30. By means of the winding 25 and potential divider 28 it is arranged that a positive feedback occurs from the collector emitter circuit to the base-emitter circuit of transistor 17 such that, in the absence of any signal to the base 20 the output stage of the amplifier oscillates at a predetermined amplitude. The frequency of this oscillation is the natural frequency of the oscillatory circuit 23, 24. Alternatively, any other suitable circuit means may be employed for rendering the output stage of the amplifier self-oscillatory.

When this oscillation occurs an alternating potential is induced in winding 26 and this potential is applied to the input terminals 31 and 32 of a squarer, indicated by the rectangle 33. Terminal 31 is connected to the base 34 of transistor 35 via a resistor 36 which serves to limit the peak current flowing in the base-emitter circuit of transistor 35. Terminal 32 is connected to the emitter 37 of transistor 35, to earth via a resistor 38 and to output terminal 39 via a capacitor 40. The collector 41 of transistor 35 is connected to output terminal 42 via capacitor 43 and to terminal 10 via resistor 48.

The peak potential induced in the secondary winding 26 is arranged to be many times larger than the total potential drop developed across the resistor 36 and the base-emitter junction of transistor 35 when the base current of transistor 35 is such as to cause transistor 35 to be fully conducting. During those half cycles when the potential induced in winding 26 is such as to cause base 34 to be negative with respect to emitter 37, transistor 35 is therefore fully conducting over substantially the whole of that half cycle. During other half cycles the base 34 is positive with respect to the emitter 37 and transistor 35 is then non-conducting. When transistor 35 is fully conducting the common connection between capacitor 43 and resistor 48 is at substantially the same potential as the common connection of capacitor 40 and resistor 38. When, however, transistor 35 is non-conducting these common connections are respectively at substantially the potential of terminal 10 and of earth. Substantially square pulses of opposite polarity are therefore transmitted via capacitors 40 and 43 to the output terminals 39 and 42 respectively, the amplitude of these pulses being substantially constant and their frequency being the frequency of oscillation of amplifier 1.

Figure 2:
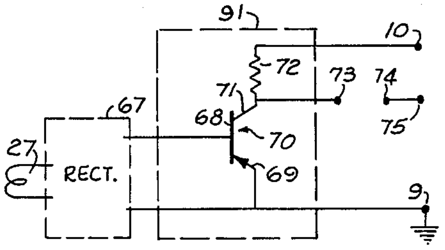
FIGURES 2, 3 and 4 are modifications of the circuit of FIGURE 1.

Terminals 39 and 42 are respectively connected to control terminals 49 and 50 of a chopper indicated by the rectangle 51. This chopper is similar to the chopper described in the paper by Chaplin and Owens, Proc. I.E.E., vol. 105, Part B, No. 21, May 1958, page 258, and the circuit of which is shown in Figure 2 (*a*) of that paper.

Input terminals 52 of the chopper is connected to output terminal 53 of the chopper via a resistor 56 and a capacitor 57 connected in series. Input terminal 54 of the chopper is connected directly to the output terminal 55 and the latter terminal is connected to earth. The common connection of resistor 56 and capacitor 57 is connected to emitter 58 of transistor 59. Collector 60 of transistor 59 is connected to earth via a resistor 61. Control terminal 49 is connected to collector 60 via a diode 62 and resistor 63 connected in series, the diode 62 being so poled as to conduct in a direction away from terminal 49. Control terminal 50 is connected to the base 64 of transistor 59 via a diode 65 and resistor 66 connected in series, the diode 65 being so poled as to conduct in a direction towards terminal 50. The common connection of diode 65 and resistor 66 is connected to earth via resistor 66*a*.

When a control signal is applied to terminals 49 and 50, of a suitable magnitude and of a polarity such that terminal 50 is positive, the transistor 59 is substantially non-conducting. When the polarity of this control signal is reversed the transistor 59 becomes conducting. Resistors 61 and 63 are so chosen that when transistor 59 is conducting their common connection is at a potential with respect to earth equal in magnitude, but of opposite polarity, to the potential drop across the collector-emitter impedance of transistor 59, thereby ensuring that the common connection of resistor 56 and capacitor 57 is then at substantially earth potential. Resistor 56 serves to ensure that the impedance of the output circuit of any source connected to input terminals 52, 54, is large compared with the collector-emitter impedance of transistor 59 when that transistor is conducting. As resistor 66*a* has a resistance which is small compared with that of resistor 66, and as the diodes 62 and 65 present their reverse resistances to leakage current flowing in the collector and base circuits respectively of transistor 59 when terminal 50 is positive and transistor 59 is non-conducting, these leakage currents are of small magnitude.

Resistors 61 and 63 and diode 62 act as a load on capacitor 40 and resistors 61, 66 and 66*a* and diode 65 act as a load on capacitor 43 during half cycles when transistor 35 is non-conducting. Consequently, unless steps were taken to prevent it, substantial potentials would be built up in capacitors 40 and 43 and these potentials would prevent the transmission of pulses from the squarer 33 to the chopper 51 and would, consequently, cause the arrangement to cease operation.

To prevent this occurring a diode 44 and resistor 45 are connected in series between terminal 39 and earth, diode 44 being so poled as to conduct in a direction away from earth, and a diode 46 and resistor 47 are connected in series between terminal 42 and earth, diode 46 being so poled as to conduct in a direction towards earth. A load is thereby connected across each of the capacitors 40 and 43 which discharges those capacitors, during half cycles when transistor 35 is conducting, to an extent depending upon the resistances of resistors 45 and 47.

In order to ensure that transistor 59 is non-conducting during alternate half cycles and, at the same time, to ensure that leakage currents in the collector and base circuits of transistor 59 are a minimum, it is desirable that resistors 45 and 47 shall have such values that the base 64 shall be at earth potential during those half cycles. As, however, it is essential that the base 64 shall not be at a small negative potential during these half cycles, it is preferably, in practice, to arrange that the resistances of resistors 45 and 47 shall be such that termianl 50 is at a small positive potential during those half cycles.

The squarer 33 is effective to ensure that the base current flowing in transistor 59 is substantially constant during those half cycles when such current flows, and has a value equal to that base current at which the transistor 59 is least subject to drift.

The chopper is effective, when an input signal of either polarity is applied to input terminals 52, 54, to modulate that input signal at the frequency of oscillation of the tuned circuit 23, 24 and thus to supply to the output terminals 53, 55 a train of pulses of an amplitude substantially equal to the input potential applied to terminals 52, 54, of a phase corresponding to the polarity of that input potential and of a frequency equal to the frequency of oscillation.

The chopper output terminals 53, 55 are respectively connected to the amplifier input terminals 2, 3. The train of pulses appearing at the output terminals 53, 55, is therefore amplified in the first stage of the amplifier and supplied to the base 20 of transistor 17. These amplified pulses are either in phase or in anti-phase with the positive feedbock signal, supplied to the base-emitter circuit of transistor 17, depending upon the polarity of the input potential applied to terminals 52, 54. When the amplified pulses are in phase with the feedback signal the amplitude of oscillation is greater than the predetermined amplitude, and when the amplified pulses are in anti-phase with the feedback signal the amplitude of oscillation is less than the predetermined amplitude, the magnitude of the increase or decrease being proportional to the amplitude of those amplified pulses and, therefore, to the magnitude of the potential applied to input terminals 52, 54. It follows that the output stage of the amplifier oscillates at a predetermined amplitude when the input potential applied to terminals 52, 54 is zero, and departs from that predetermined amplitude in proportion to the magnitude of that input potential and in a sense corresponding to the polarity of that input potential.

Figure 6:
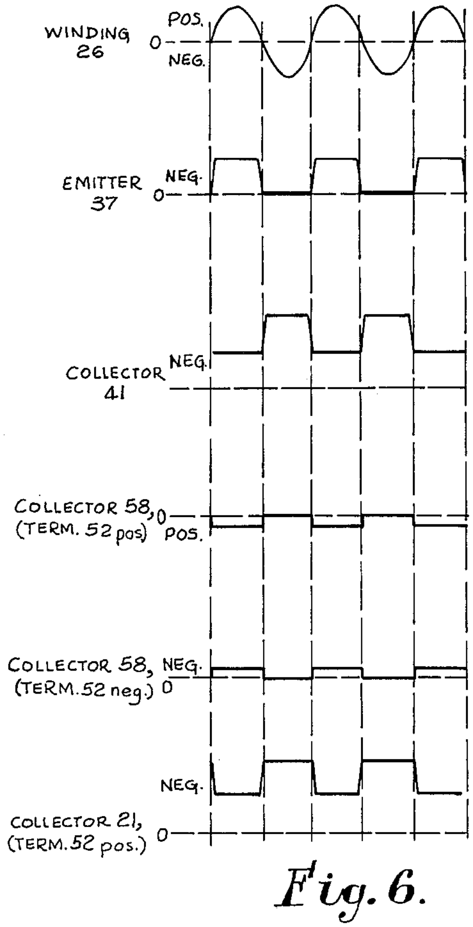
FIGURE 6 shows waveforms present at key points in the circuit of FIGURE 1.

FIGURE 6 shows waveform diagrams at the key points of FIGURE 1 indicated at the left of each diagram.

The squarer 33 may be omitted and winding 26 may then be connected directly to the control terminals 49 and 50 of chopper 51. As, however, the base current flowing in transistor 59 is not then of such value, throughout the half cycles when such current flows, that the drift in transistor 59 is least, the squarer is preferably included.

As explained above, the chopper 51 is so arranged that the common connection of resistor 56 and capacitor 57 is at substantially earth potential when transistor 59 is conducting. Consequently, the amplitude of the signal supplied to the input terminals 2, 3 of amplifier 1 is dependent only upon the amplitude of the potential applied to the input terminals 52, 54. The gain of the closed loop consisting of the amplifier 1, squarer 33 (if a squarer is used) and chopper 51 is therefore zero and there is, consequently, no tendency whatsoever for this loop to be self-oscillatory.

A potential proportional to the amplitude of oscillation is induced in winding 27.

Instead of the output stage of the amplifier 1 being self oscillatory, a separate local oscillator generating oscillations of a predetermined amplitude and a non-oscillatory amplifier may be employed. The amplifier and the local oscillator then supply output signals to a mixer circuit which provides in its output an oscillatory signal dependent upon the magnitude of the algebraic sum of the output signals from the amplifier and oscillator. The mixer output or the local oscillator output is supplied to the control terminals of a chopper similar to the one described above and the output terminals of the chopper are connected to the input terminals of the amplifier. In such an arrangement the winding 27 is replaced by suitable connections to the mixer circuit. It is, however, more economical to use the output stage of the amplifier as both an amplifier and a source of oscillation.

The output of the winding 27 or mixer circuit may be converted into a potential proportional to the input potential applied to terminals 52, 54 but of an increased amplitude and of a polarity corresponding to the polarity of that input potential. This may be done, for example, by combining the circuit of FIGURE 1 with that of FIGURE 2.

In the circuit of FIGURE 2 the output of winding 27 is rectified by means of a conventional rectifier indicated by the rectangle 67. The output of this rectifier is applied to a buffer amplifier stage, indicated by the rectangle 91 and comprising a transistor 70, the output of rectifier 67 being applied between the base 68 and emitter 69 of transistor 70. The emitter 69 is connected to the power input terminal 9 and the collector 71 of transistor 70 is connected via a resistor 72 to power input terminal 10. Output terminals 73 and 74 are respectively connected to collector 71 and a third power input terminal 75.

In operation, the third power input terminal 75 is connected to an intermediate tap on a D.C. source connected to terminals 9 and 10. When the input potential applied to terminals 52, 54 (FIGURE 1) is zero the amplitude of oscillation has a predetermined value determined by the position of slider 29, the output of rectifier 67 (FIGURE 2) has a predetermined value, and the potential drop across resistor 72 and the potential of terminal 73 therefore have predetermined values also. By adjustment of the position of slider 29 the amplitude of oscillation is adjusted to a value at which the potential of terminal 73 is equal to that of terminal 74. When the input potential applied to terminals 52, 54 departs from zero the output of rectifier 67 departs from its predetermined value in proportion to the magnitude of that input potential and in a sense corresponding to the polarity of that input signal. As the current in the collector-emitter circuit of transistor 70 varies in proportion to the output of rectifier 67, the potential of terminal 73 differs from that of terminal 74 in proportion to the input potential applied to terminals 52, 54 and the sense of that difference corresponds to the sense of that input potential. In order that the maximum difference in potential between terminals 73 and 74 shall be the same whatever the sense of that difference, the potential of terminal 75 is preferably the mean of the potential of terminals 9 and 10.

Figure 3:
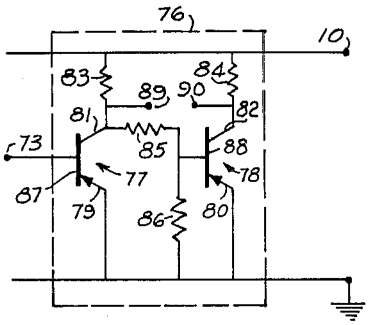

In order to double substantially the range of variation of the output potential the circuit of FIGURE 2 may be modified as shown in FIGURE 3, the potential between terminal 73 and earth being applied to a phase inverting circuit, indicated by the rectangle 76.

This phase inverting circuit 76 may, for example, comprise a pair of transistors 77 and 78 having their respective emitters 79, 80 connected to terminal 9 and their respective collectors 81, 82 connected to terminal 10 via similar load resistors 83 and 84 respectively, the collector 81 being connected to terminal 9 via a potential divider formed by two resistors 85 and 86, the common connection of these two resistors being connected to the base 88 of transistor 78. The terminal 73 is connected to the base 87 of transistor 77 and the collectors 81 and 82 are connected to output terminals 89 and 90 respectively. The phase inverting circuit 76 is so arranged that, when the potential of terminal 73 has a predetermined value corresponding to zero input potential applied to terminals 52, 54 (FIGURE 1), the currents flowing in the collectors 81, 82 of transistors 77 and 78 are equal and so that, when the potential of terminal 73 changes these currents change by equal amounts in opposite directions. The potentials of terminals 89 and 90 therefore depart from equality in opposite directions and by equal amounts when the potential of terminal 73 changes, with the result that the potential difference between terminals 89 and 90 is proportional to the magnitude of the input potential applied to terminals 52, 54. Furthermore, the potential difference between terminals 89, 90 corresponds in sense to the polarity of that input potential.

The resistors 83 and 84 are preferably the filaments of metal filament lamps. For a predetermined potential difference between terminals 89 and 90 the total current flowing in resistors 83 and 84 is then less than it would be if resistors 83 and 84 had fixed values. Consequently the load on the direct current source connected to terminals 9 and 10 is then reduced. Furthermore, as the gain of the transistors 77 and 78 increases as the load current falls, the arrangement then becomes more sensitive.

The phase-inverting circuit 76 may, alternatively, comprise a pair of transistors connected as a long-tailed pair, the circuit being modified in a manner which will be apparent to one skilled in the art.

The arrangements described above with reference to FIGURES 1 and 2 and with reference to FIGURES 1, 2 and 3 may form part of a servo-operated potential responsive device.

Figure 4:
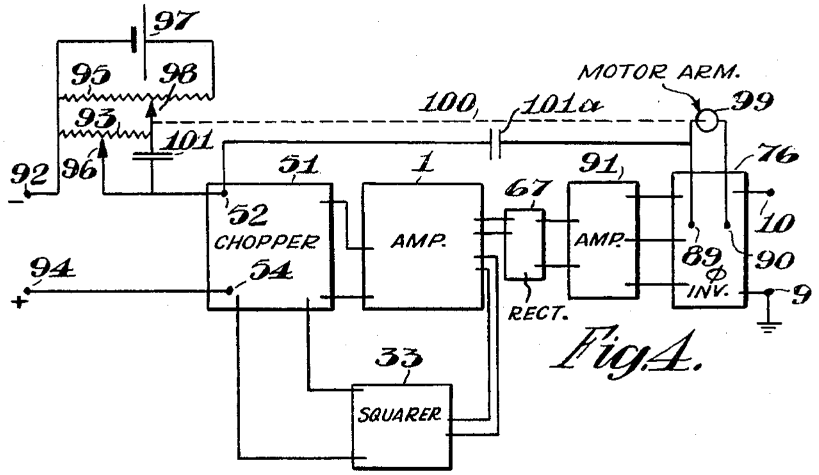

FIGURE 4 is the partly schematic circuit of one such device arranged as a self-balancing potentiometer. This device comprises a chopper 51, squarer 33, amplifier 1, rectifier 67, buffer amplifier 91 and phase inverting circuit 76 interconnected as described above with reference to FIGURES 1, 2 and 3. The input potential to which the device is responsive is applied to terminals 92, 94. Terminal 92 is connected to one end of each of the potential dividers 93 and 95. Slider 96 is connected to terminal 52 and terminal 94 is connected to terminal 54. A source 97 of stabilised unidirectional potential is connected across potential divider 95 and the slider 98 is connected to that end of potential divider 93 which is remote from terminal 92. Slider 98 is driven by the armature 99 of a permanent magnet D.C. motor connected across terminals 89 and 90, the mechanical connection between this slider and the armature being indicated in the figure by the dotted line 100. The proportion of the potential appearing between terminal 92 and slider 98 which is applied between terminals 52 and 54 is manually adjustable by adjustment of the position of slider 96. The polarity of the source 97 is such that the potential appearing between terminal 92 and slider 96 is opposed to that applied to terminals 92, 94. As indicated in the figure, terminal 92 is normally negative with respect to terminal 94 and the negative pole of source 97 is connected to terminal 92. Alternatively, however, the polarities of the potential applied to terminals 92, 94, and of the source 97 may be reversed. The armature 99 is arranged to drive the slider 98 in a direction such that the difference between the potential applied to terminals 92, 94 and the potential appearing between terminal 92 and slider 96 is reduced. The arrangement is thus self-adjusting and is operative to maintain this difference at substantially zero. As the displacement of slider 98 is thus a measure of the potential applied to terminals 92, 94 an indicating or recording device (not shown) may be arranged to move with slider 98 to provide an indication or record of the potential applied to terminals 92, 94.

Manual adjustment of the position of slider 96 enables the range of potential to which the arrangement will respond to be adjusted to any convenient magnitude.

The buffer amplifier 91 may be omitted and the output of rectifier 67 may be supplied directly between terminal 9 and the base 87 of transistor 77 (FIGURE 3) provided that the load on the tuned circuit 23, 24 (FIGURE 1) is not thereby made unduly high.

As the potential applied to the armature 99 varies from zero in proportion to the difference potential applied to terminals 52, 54 the torque developed by the motor increases as the device departs from equilibrium, in which condition the armature 99 is stationary, and decerases as the device approaches equilibrium. The device thus possesses an inherent tendency not to hunt.

In order to reduce any tendency to hunting which may occur, a capacitor 101 is connected between slider 98 and terminal 52. Let it be assumed, for example, that the potential applied to terminals 92, 94 falls from a value at which the device is in equilibrium. Terminal 92 will become less negative and the armature 99 will drive in a direction such that slider 98 moves towards the left-hand end, as shown in FIGURE 4, of potential divider 95. The potential of slider 98 will therefore become less positive and a transient negative potential will be applied via capacitor 101 to terminals 52, 54. This transient potential thus opposes the change in the potential applied to terminals 92, 94 and has a magnitude proportional to the speed of rotation of the armature 99. The effect of introducing the capacitor 101 is thus to reduce the potential applied to terminals 52 and 54 while the arrangement is readjusting itself to equilibrium after a disturbance. This reduction in the potential applied to terminals 52, 54 causes a reduction in the potential applied to armature 99. The speed of rotation of the armature during the period of readjustment is thereby reduced with a consequent reduction in the tendency to hunting.

Alternatively, hunting may be reduced by, for example, connecting terminal 89 to terminal 52 via a capacitor 101*a* to provide at terminal 52 a transient potential which opposes the corresponding change in the potential applied to terminals 92, 94. In this alternative arrangement the transient potential is substantially proportional to the rotary acceleration of the armature 99 and the stabilisation achieved has a slightly different characteristic from that of the device shown in FIGURE 4. If this alternative anti-hunting arrangement is used it is advantageous to ensure that the potentials of terminals 89 and 90 with respect to earth are free from ripple of the oscillatory frequency.

The ripple may conveniently be substantially eliminated by providing two capacitors (not shown), one being connected between collector 81 and base 87 of transistor 77 (FIGURE 3) and the other being connected between collector 82 and base 88 of transistor 78.

Figure 5:
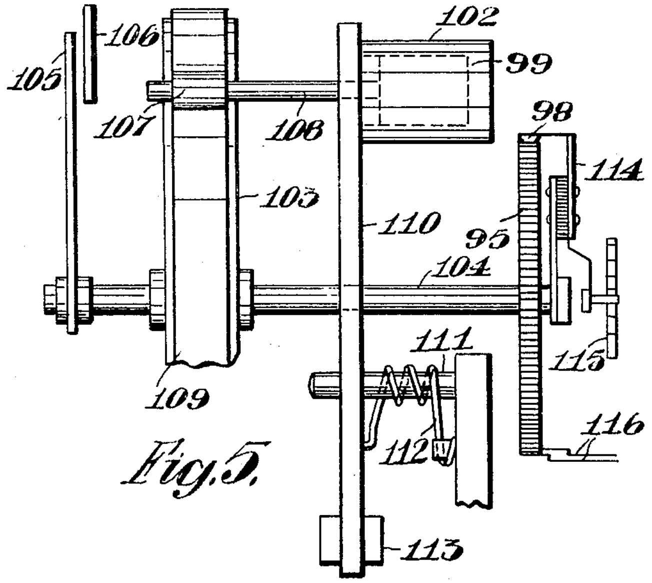

As shown in FIGURE 5, the armature 99 of the permanent magnet D.C. motor 102 preferably drives a disc 103 mounted upon a shaft 104, the angular position of which is indicated by a pointer 105 moving over a scale 106. The disc 103 is driven through a friction drive formed by the abutment of a sleeve 107, provided on the spindle 108 of the armature 99, with a ring 109 provided on the periphery of the disc 103. The motor 102 is mounted, with the spindle 108 parallel to the shaft 104, upon an arm 110 mounted upon a pivot 111, the arm 110 being biassed by means of a spring 112 in order to maintain a pressure between the spindle 108 and the disc 103. Preferably the combination of the motor 102 and the arm 110 is mechanically balanced by means of a counterweight 113 in order to prevent this pressure being disturbed by mechanical shock or vibration. Also mounted upon the shaft 104 is a contact arm 114, insulated from the shaft 104 and carrying at its end the slider 98. The potential divider 95 is of arcuate form having the centre of the arc on the axis of the shaft 104. Electrical connections to the contact arm 114 and to the potential divider 95 are made via a hair spring 115 and conductors 116 respectively.

In the arrangement described above with reference to FIGURES 4 and 5 it is essential that movement of the pointer 105 shall correspond accurately to changes in the potential applied to terminals 92, 94. So far as the applicants are aware, in all known servomotor means employing an electric motor for accurately positioning a movable member, such as the pointer 105, in accordance with an input signal, the motor and the movable member are coupled together via a backlash-free gear train. By adopting a friction drive and by supporting the motor on a pivoted arm the present invention eliminates the need for accurately machined gears and, consequently, considerably reduces cost. The choice of a friction drive in place of a gear drive does not result in any reduction in the accuracy with which the pointer 105 is positioned, because the disc 103 moves with the slider 98 and the slider 98 must take up a position at which the potential applied to terminals 52, 54 is substantially zero.

What is claimed is:

1. An electronic oscillator comprising an amplifier arranged to be self-oscillatory and having input terminals and an inductive output winding, a chopper having input, output and control terminals, said output winding of said amplifier being coupled to the control terminals of said chopper so that said chopper provides at its output terminal a train of pulses of an amplitude dependent upon the magnitude of a unidirectional input signal applied to said input terminals, of a phase dependent upon the polarity of said input signal and of a frequency equal to the frequency of oscillation of the amplifier, said output terminals of said chopper being coupled to the input terminals of said amplifier and the arrangement being such that the amplitude of oscillation of said amplifier departs from a predetermined magnitude in proportion to the magnitude of said input signal to said chopper and in a sense corresponding to the polarity of said input signal.

2. An electronic oscillator comprising an amplifier, a local oscillator arranged for generating oscillations of a predetermined amplitude, a mixer circuit to which the outputs of said amplifier and said local oscillator are applied and which provides in its output an oscillatory signal dependent upon the magnitude of the algebraic sum of the output signals from the amplifier and said local oscillator, a chopper having input, output and control terminals and arranged to provide at its output terminals a train of pulses of an amplitude dependent upon the magnitude of a unidirectional input signal applied to said input terminals, of a phase dependent upon the polarity of said input signal and of a frequency equal to the frequency of an oscillatory potential applied to said control terminals, the output of said mixer or local oscillator being connected to said control terminals, said output terminals of said chopper being connected to the input terminals of said amplifier and the arrangement being such that the amplitude of the output signal of said mixer departs from a predetermined magnitude in proportion to the magnitude of said input signal and in a sense corresponding to the polarity of said input signal.

3. A self-balancing potentiometer means including an oscillator according to claim 1, potentiometer input terminals to which a unidirectional potentiometer input signal may be applied, means including a movable slider connected to said chopper input terminals and arranged for applying thereto a balancing unidirectional potential in opposition to said potentiometer input signal and having a magnitude dependent upon the position of said movable slider, motor means operable to move said slider and so energised in dependence upon the amplitude of oscillation that said slider is moved to restore the sum of the potentals applied to the chopper input terminals to zero after a disturbance.

4. Potentiometer means according to claim 3, wherein said motor is a direct current motor having a rotatable armature and including motor energising means having its input inductively coupled to said output winding and its output connected across the armature of said motor, said motor energising means supplying said armature with a current which changes gradually from a maximum in one direction to a maximum in the other direction as the amplitude of oscillation changes gradually from zero to maximum.

5. Potentiometer means according to claim 4 including a rotatable disc frictionally driven by the shaft of said armature and means operatively connecting said disc to said slider.

6. A potentiometer means according to claim 4 wherein said motor energising means includes rectifier means having its input inductively coupled to said output winding of said amplifier and providing in its output a unidirectional potential dependent upon the amplitude of oscillation, a pair of electron discharge amplifying devices connected across a source of unidirectional current and each having a load resistance connected at one end to one terminal of the source of current, the output of the rectifier means being coupled to the input of one of said amplifying devices for varying the current through the corresponding load resistance in one direction, means coupling the output of said one amplifying device to the input of the second amplifier for varying the current through the other load resistance in the opposite direction, said armature being connected between the other ends of said load resistances.

7. A potentiometer means according to claim 5 including a pivoted arm arranged for supporting said motor and a spring arranged to bias the arm to maintain frictional engagement of said shaft with the periphery of said disc, said arm and motor being mechanically balanced about the axis of said pivot, so that the frictional engagement pressure is independent of attitude of said means.

References Cited by the Examiner

UNITED STATES PATENTS

| | | | |
|---|---|---|---|
| 2,404,891 | 7/46 | Schmidt | 318—28.4 |
| 2,423,540 | 7/47 | Wills | 318—28.4 |
| 2,586,686 | 2/52 | Medlock | 324—99 |
| 2,685,056 | 7/54 | Hester | 321—49 |
| 2,905,875 | 9/59 | Fielden | 318—31 |
| 3,004,199 | 10/61 | Sakson | 318—28.1 |
| 3,088,076 | 4/63 | Burwen | 330—10 |
| 3,131,357 | 4/64 | Maltby | 330—10 |
| 3,146,408 | 8/64 | Nissim et al. | 330—10 |
| 3,148,335 | 9/64 | Young | 330—10 |

LLOYD McCOLLUM, Primary Examiner.

MILTON O. HIRSHFIELD, *Examiner*.